United States Patent [19]

Diaz

[11] 4,064,917
[45] Dec. 27, 1977

[54] APPARATUS FOR CUTTING AND FORMING FLEXIBLE BEAM LEADS OF AN INTEGRATED CIRCUIT CHIP

[75] Inventor: Nelson Ramon Diaz, Phoenix, Ariz.

[73] Assignee: Honeywell Information Systems Inc., Pheonix, Ariz.

[21] Appl. No.: 733,557

[22] Filed: Oct. 18, 1976

[51] Int. Cl.² .............................................. B21F 1/00
[52] U.S. Cl. ..................................... 140/105; 72/330; 72/DIG. 10
[58] Field of Search ................... 140/105; 72/330, 38, 72/335, DIG. 10; 29/626, 628; 113/119

[56] References Cited

U.S. PATENT DOCUMENTS

| | | | |
|---|---|---|---|
| 1,070,682 | 8/1913 | Graf | 72/38 |
| 3,698,618 | 10/1972 | Helda | 29/626 |
| 3,769,823 | 11/1973 | Greeninger | 72/335 |
| 3,796,201 | 3/1974 | Golub | 140/105 |
| 3,882,597 | 5/1975 | Chayka et al. | 29/626 |

*Primary Examiner*—Lowell A. Larson
*Attorney, Agent, or Firm*—Edward W. Hughes; William W. Holloway, Jr.

[57] ABSTRACT

Apparatus for blanking an integrated circuit (I.C.) chip and the chip's thin flexible ductile leads from a segment of film and forming the leads of the chip in a single operation of a hollow punch having cutting and forming edges and a hollow die having cutting edges with a forming block having forming edges positioned within the die. The punch and die are mounted on a punch press. Alignment pins are provided which at the beginning of each blanking and forming operation engage reference sprocket holes of a film segment to which an I.C. chip is mounted to accurately position the chip and its leads with respect to the punch and die. A pressure pad is mounted in the punch and presses the leads against a portion of the forming block to isolate the bonds between the leads and the integrated circuit chip from forces applied to the leads during cutting and forming. The punch then approaches the die until the cutting edges of the punch and die sever the leads and the forming edges of the punch and forming block bend the leads. The severed I.C. chip and its formed leads are lifted from the forming block by being held against the pressure pad by a vacuum as the punch returns to its initial position.

17 Claims, 4 Drawing Figures

APPARATUS FOR CUTTING AND FORMING FLEXIBLE BEAM LEADS OF AN INTEGRATED CIRCUIT CHIP

BACKGROUND OF THE INVENTION

1. Field of the Invention

This invention is in the field of blanking and forming dies and more particularly to apparatus for blanking an I.C. chip and its leads from a film segment and forming the leads bonded to the chip which leads are made of a very thin ductile electrical conductor in a single operation with the result that the chip and its leads are ready to be mounted on a substrate or to be packaged.

2. Description of the Prior Art

The development of I.C. chips, particularly medium and large scale I.C. chips and of manufacturing processes for automating connecting conductuve flexible beam leads to such chips has created a need for improved manufacturing process for blanking a chip and its leads from their carrier and forming the leads to facilitate subsequent placing of such chips and their leads of substrates or in packages for connection into electrical circuits. It is known to use a relatively long tape like carrier, similar to standand motion picture film, to which is bonded a thin metallic layer of a suitable electrical conductor such as copper, nickel or aluminum. The metal layer can be formed into lead frames of the desired configuration by conventional photo-etching processes. Subsequently, an I.C. chip is bonded to each lead frame. The prior art also teaches blanking a chip and its leads, a portion of the lead frame, and forming the leads either prior to the blanking operation or subsequent thereto as separate and distinct operations using different equipment.

The lead frame and the leads for each chip are made of very thin ductile metal, copper 0.0014 inches thick, for example, and when a chip is to be mounted on a substrate all the leads of the chip, up to forty in one example, must be formed so that they abut conductive pads of the substrate which are approximately 0.014 inches square. In forming the leads of I.C. chips, it is necessary that the angle of spring back be from 0° to 5°. The problem with the prior art has been that heretofore it was impossible to cut and form the leads of such thin ductile materials, to such dimensions with the desired degree of accuracy in a single operation.

SUMMARY OF THE INVENTION

The present invention provides apparatus for blanking an integrated circuit chip and its leads from a segment of film and forming the leads in a single cycle of operation of a punch press so that the chip and its leads are ready for the next step in the manufacturing process such as for the chip and its leads to be mounted on a substrate or to be placed in a suitable package.

A hollow die with cutting edges is mounted on the base plate of a punch press with a forming block having forming edges positioned within the die. A recess is provided in the upper face of the forming block which can accommodate an I.C. chip during the blanking and forming operation without subjecting the chip or the bonds between the chip and its leads to damaging stresses. A hollow punch is mounted on the top plate of the press. The punch has cutting edges which during one cycle of operation of the press in conjunction with the cutting edges of the die sever the chip and a part of its leads from the balance of the lead frame. In addition, the punch has forming edges which in conjunction with the forming edges of the forming block bend the leads of the chip to their desired configuration. The punch is provided with a pressure pad which forces the leads of a chip in a recess provided for it in the forming block against the upper face of the forming block to isolate the bonds between the chip and its leads from stresses applied to the leads while they are being severed and formed. Alignment pins movable with the press top plate accurately position a segment of film, the lead frame attached to the segment, and the chip bonded to the inner portion of the frame relative to the die and forming block before the pressure pad contacts the leads. The pressure pad remains in contact with the leads until after the chip and its leads have been severed from the segment and the leads have been formed. The chip and its formed leads are then removed from contact with the forming block as the punch is withdrawn to complete a cycle of operation.

The present invention solves the prior art problem of blanking and forming with a high degree of precision very thin ductile material in a single cycle of operation. More particularly, the present invention solves the problem of cutting the leads of an I.C. chip which leads are made of a very thin ductile electrical conductor from the balance of the lead frame and the film carrier to which the frame is attached and of forming the leads. These steps are performed with a very high degree of precision essentially simultaneously during a single cycle of operation of a punch press.

It is, therefore, an object of this invention to provide a blanking and forming die set that can cut and form thin ductile metals in a single operation.

It is a further object of this invention to provide apparatus for blanking an integrated circuit chip and its leads from a flexible lead frame mounted on a carrier without stressing the bonds between the leads and the chip.

It is still a further object of this invention to provide apparatus for cutting and forming flexible beam leads of an integrated circuit chip which does not damage the chip and cuts and forms the leads without damaging the leads in a single operation and with a high degree of precision.

BRIEF DESCRIPTION OF THE DRAWINGS

Other objects, features and advantages of the invention will be readily apparent from the following description of the preferred embodiment thereof, taken in conjunction with the accompanying drawings, although variations and modifications may be effected without departing from the spirit and scope of the novel concepts of the disclosure, and in which.

DESCRIPTION OF THE PREFERRED EMBODIMENT

Figure 1:
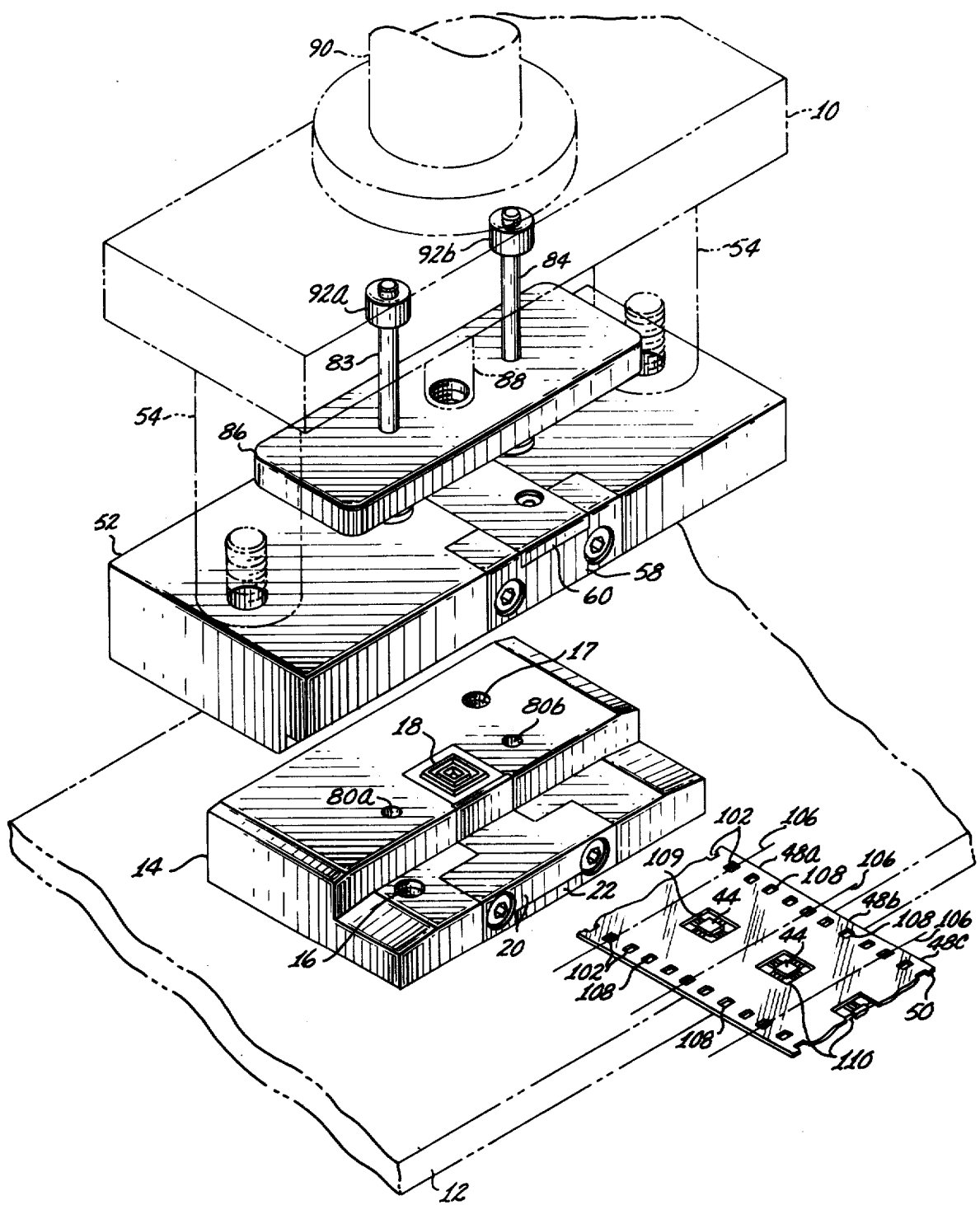
FIG. 1 is an isometric view of the die set of the invention with the punch retracted from the die and a fragmentary portion of a film strip to which is attached lead frames with an integrated circuit chip attached to each lead frame.

Referring to FIG. 1, top plate 10 and bottom, or base, plate 12, which are illustrated in phantom, are part of a conventional punch press which may be energized in any suitable manner including by hand, which press is not further illustrated. Base plate 12 is fixed relative to top plate 10, and top plate 10 moves reciprocally and linearly with respect to base plate 12. Die holder 14 is removably secured to bottom plate 12 by bolts which extend through base plate 12 and are threaded into openings 16 and 17 in die holder 14. Die 18, which is illustrated in greater detail in FIGS. 2 and 3, is rigidly held in place in die holder 14 by die retainer 20 which is bolted to die holder 14 and by die retaining plate 22 which is bolted by conventional bolts, which are not illustrated, to die retainer 20 and die holder 14.

Figure 2:
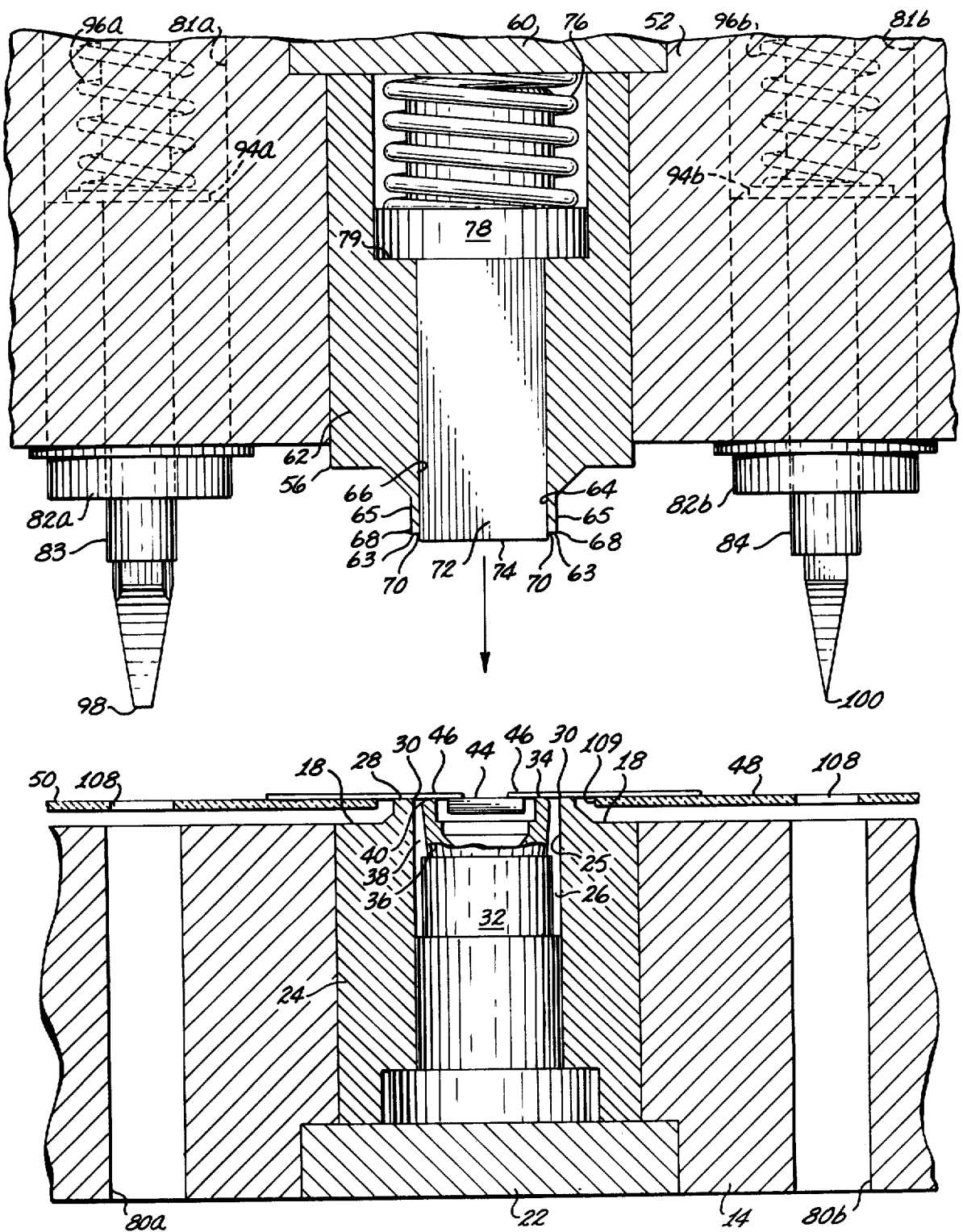
FIG. 2 is an enlarged fragmentary sectional view of the features of the die set with the punch in its retracted position illustrating the relation of the die set to a segment of a film strip to which is secured a lead frame and an integrated circuit chip.
Figure 3:
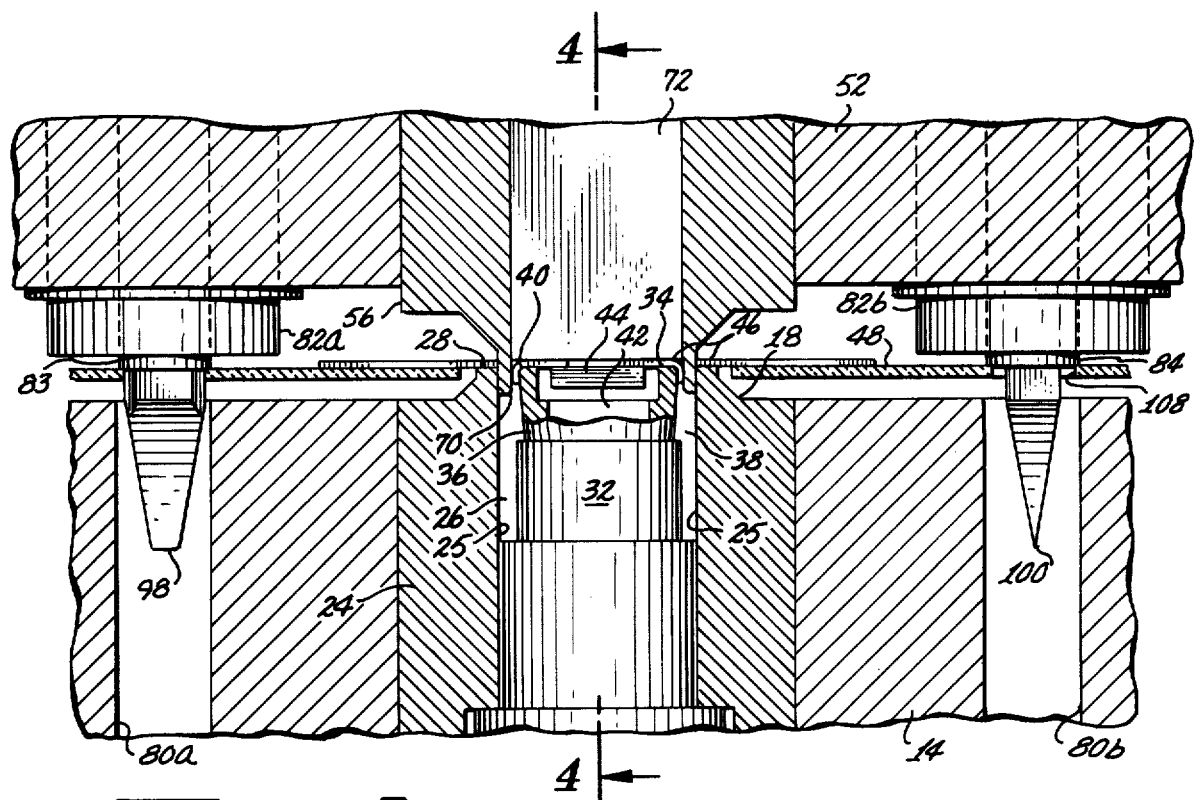
FIG. 3 is similar to FIG. 2 showing the punch at its downward position at the completion of cutting and forming the leads of an I.C. chip.

Referring to FIG. 2, hollow die 18 is formed from die wall 24 which has, in a preferred embodiment, four inner rectangular contiguous planar surfaces 25 of substantially equal dimension, in a preferred example, which form die recess 26. Die wall 24 also has an upper planar surface 28 which is perpendicular to the inner walls 25. The intersections of upper surface 28 and inner surfaces 25 are the continuous cutting edges 30 of die 18. Cutting edges 30 define or lie in a die cutting plane which coincides with upper planar surface 28 and the cutting edges 30 define a square in the die cutting plane, in a preferred embodiment.

Forming block 32 is fixedly positioned in die recess 26 so that its planar upper, or top, surface 34 is coplanar with the upper surface 28 of die 18. Contiguous outer planar surfaces, or side walls, 36 of forming block 32 which slope inwardly, in a preferred embodiment, at an angle of five degrees, are spaced from inner surface 25 of die 18 to define a punch receiving space 38. The intersection of upper surface 34 and outer surfaces 36 are rounded to a radius in a preferred embodiment of 0.0020 inches to form continuous bending or forming edges 40 of forming block 32. An I.C. chip receiving recess 42 is formed in upper surface 34 of block 32 to receive a work piece, or an I.C. chip, 44 which is bonded to leads 46. Leads 46 are in turn bonded to a segment 48 of film strip, or carrier, 50.

In FIG. 1, punch holder 52 is removably secured to top plate 10 in any conventional manner such as by a pair of posts or dowels 54 which are bolted to top plate 10 and to punch holder 52. Hollow punch 56, which is not seen in FIG. 1, is removably secured to punch holder 52 by punch retainer 58 which is bolted to punch holder 52, and by punch retaining plate 60 which is bolted to punch retainer 58 and punch holder 52.

Punch 56, as is illustrated in FIGS. 2 and 3, is formed from punch wall 62 which has a planar bottom surface 63, substantially vertical planar inner surfaces 64 which are contiguous to one another and substantially vertical planar contiguous outer surfaces 65. The inner surfaces 64 define a punch space or recess, 66 having a square cross section in a preferred embodiment. The intersections of the bottom surface 63 and the outer surfaces 65 of wall 62 form the continuous cutting edges 68 of punch 56. Cutting edges 68 define, or lie in, a punch cutting plane which coincides with bottom surface 63 of wall 62, and cutting edges 68 define a square, in the preferred example, in the punch cutting plane. The intersections of the bottom surface 63 and inner surfaces 64, which in a preferred example are rectangular, are rounded to a radius of 0.010 inches, in a preferred embodiment, to continuous create forming edges 70. The forming edges 70 also define a square in a preferred embodiment.

Figure 4:
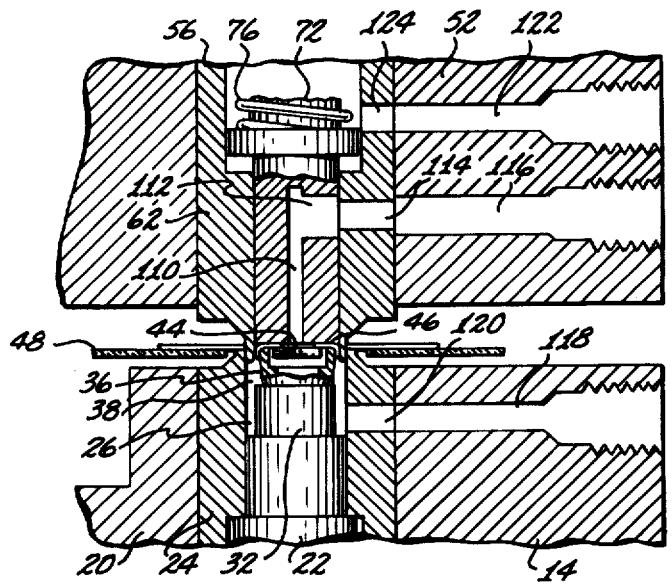
FIG. 4 is a sectional view at a reduced scale taken on line 4—4 of FIG. 3.

Pressure pad 72, which is made of a resilient material, nylon in the preferred embodiment, is mounted in the punch recess 66 of punch 56 for reciprocal linear motion with respect thereto. Pressure pad 72 has a bottom planar surface 74 substantially parallel to the bottom surface 63 of punch 56. Pad 72 is biased downwardly by spring 76 positioned between punch retaining plate 60 and a ring 78 formed integrally with pad 72. Downward movement of pad 72 in FIG. 2, for example, is limited by the engagement of ring 78 against shoulder 79 formed in wall 62 of punch 56. When pressure pad 72 is in its most downwardly position relative to the punch 56, as illustrated in FIG. 2, it projects slightly below the bottom surface 63 of punch 56, 0.010 inches in a preferred embodiment. Pad 72 can move vertically within recess 66 the extent necessary, as illustrated in FIGS. 3 and 4, to permit punch 56 to complete its downward stroke of an operational cycle without applying excessive force to the leads 46 of a chip 44 sufficient to damage them.

Die holder 14 is provided with a pair of vertical die alignment bores 80a and 80b and punch holder 52 is also provided with a pair of punch alignment bores 81a and 81b. Ball bushing 82a is mounted in bore 81a and ball bushing 82b is mounted in bore 81b. A film segment positioning pin 83 is mounted for reciprocal linear motion in bushing 82a and a second film segment alignment pin 84 is mounted for reciprocal linear motion in bushing 82b. Alignment plate 86 is provided with a pair of bores through which pins 83 and 84 slidably fit. Plate 86 is operatively connected to piston rod 88 of a conventional air cylinder 90 which is fixedly mounted on top plate 10. It should be noted that air cylinder 90, since it is conventional, is only partially shown in phantom lines in FIG. 1. Each of the pins 83, 84 is provided with a collar 92a or 92b adjustably secured thereto and a retaining ring 94a or 94b. Springs 96a, 96b are positioned around each of the pins between the retaining rings 94a or 94b and the bottom of plate 86. The collars 92a, 92b are positioned on pins 83, 84 so that they are above plate 86 as can be seen in FIG. 1. Plate 86, when it is placed in its retracted, or up position, by piston rod 88, withdraws pins 83 and 84 to the extent that the points 98, 100 are retracted within punch holder 52, and when plate 86 is in its projected or downward position the points 98 and 100 project below the bottom edge of bottom surface 63 of punch 56 as can be seen in FIG. 2 and project into the alignment bores 80a, 80b of die holder 14 when punch holder 52 is at the bottom of its down stroke as illustrated in FIG. 3.

Referring to FIG. 1, film strip or carrier 50 is made of a flexible material of substantially uniform thickness. Sprocket holes 102 are formed in two substantially parallel rows along the edges of film strip 50. The film strip 50 is divided into a plurality of segments 48a, 48b and 48c, with the boundaries between segments being indicated by dashed lines 106. In each segment 48, a pair of sprocket holes 108 on opposite sides of strip 50 are designated as the reference sprocket holes. In addition, each segment 48 has a window 110 within which is positioned I.C. chip 44 which is secured by leads 46 of a lead frame to film strip 50. For more details with respect to the film strip, the lead frame and the details of the segment, reference is made to the Application of John L. Kowalski entitled Fixture for an Integrated Circuit Chip, Ser. No. 671,238 filed Mar. 29, 1976 which issued as U.S. Pat. No. 4,007,479 on Feb. 8, 1977 and which patent is assigned to the same assignee as this Application.

In FIG. 1, conventional guides or mechanisms to advance film strip 50 a segment at a time into a position in which a chip 44 and its leads 46 which project from the four sides of chip 44 can be blanked from a segment 48 and then to remove the segment 48 to automate the cutting and forming process are not illustrated. One reason for not illustrating them is that they form no part of this invention. A second reason is because the segments 48 can be severed from strip 50 and each segment 48 can be manually positioned on die 18 at the beginning of a cycle of operation. Further, a segment from which a chip and its leads have been blanked can be removed by hand from the die set at the end of each cycle of operation.

A single cycle of the blanking and forming operation is defined as starting with top plate 10 of the press in its retracted, or most remote position from the base plate 12 with top plate 10 moving in a substantially straight line toward plate 12 until the distance between the plate 10 and base plate 12 is a minimum, i.e., when the punch 56 is positioned relative to die 18 substantially as illustrated in FIG. 3. Top plate 10 then moves upward to return to its initial position completing the cycle. Prior to the beginning of a cycle, a segment 48 of film strip 50 is positioned above die 18 with its reference sprocket holes 108 substantially aligned with alignment bores 80a, 80b in die holder 14 with its chip 44 located within chip receiving recess 42 of forming block 32. As top plate 10 moves toward base plate 12, compressed air is applied to cylinder 90 which drives plate 86 downwardly toward punch holder 52 and through the actions of springs 96a and 96b acting on retaining rings 94a, 94b causes alignment pins 83 and 84 to project below the bottom surface 63 of punch 56. The points 98, 100 of alignment pins 83, 84 are shaped to readily enter the reference sprocket holes 108 and to accurately position a segment 48 so that chip 44 and its leads 46 are properly positioned with respect to die 18 and forming block 32 as well as punch 56. As a result, leads 46 will be severed at the intended locations and will then be properly formed. As the downward stroke of top plate 10 and punch 56 continues, the bottom surface 74 of pressure pad 72 contacts the upper surfaces of leads 46 of a chip 44 in recess 42 and forces leads 46 against the upper surfaces, or lands, 34 of forming block 32. Pressure pad 72 is biased downwardly by spring 76 acting against ring 78 of pad 72. As punch 56 continues to move die 18, pressure pad 72 retracts within punch 56 as can be best seen in FIG. 3. The function of pressure pad 72 is to force the leads 46 against lands 34 of forming block 32 with sufficient force to isolate the connections, or bonds, between leads 46 and chip 44 so that essentially no forces applied to the leads 46 during the cutting and forming operation will be transmitted to the bonds between the leads and chip 44.

The next step is the cutting of the leads 46 by the cutting edges 68 of punch 56 and the cutting edges 30 of die 18. Because of the thickness of leads 46, 0.0014 inches in a preferred example, the dies are made with an accuracy of 0.0001 inches and the clearance between the punch and die cutting edges is also 0.0001 inches. As the punch continues to move downwardly, the now severed leads 46 are bent or formed by the forming edges 70 of punch 56 and the forming edges 40 of forming block 32 until leads 46 have a substantially 90° bend as can be seen in FIG. 3. The spacing between forming edges 40 of forming block 32 and the forming edges 70 of punch 56 is substantially equal to the thickness of leads 46. In a preferred embodiment in which leads 46 are 0.0014 inches thick, this spacing is 0.0015 inches. The outer surfaces 36 of forming block 32 are sloped inwardly from edge 40 to prevent the ductile metal, copper in a preferred embodiment, of leads 46 from being elongated or broken by contact with the inner surfaces 64 of punch 56 as punch 56 completes its downward movement. In a preferred embodiment, the punch 56 penetrates into the punch recess 38 0.020 inches. As top plate 10 begins to move upwardly toward its starting position to complete a cycle, bore 110, which is formed in the center of pressure pad 72, is connected to a conventional source of less than atmospheric pressure, or vacuum, which is not illustrated, through horizontal bore 112 in pad 72, bore 114 through the wall 62 of punch 56 and bore 116 of punch holder 52. As punch 56 rises, chip 44 and its leads 46 are held against bottom surface 74 of pressure pad 72 by the resulting air pressure gradient so that chip 44 and its formed leads are lifted away from forming block 32. Top plate 10 will then rise to its uppermost position to complete the cycle of operation. Shutting off or disconnecting the source of vacuum from bore 110 permits chip 44 and its leads to be released for removal by hand, for example. Similarly, segment 48 can also be removed from die 18 by hand or any other suitable means in preparation for cutting and forming the leads of the next chip mounted on a similar segment.

A blast of compressed air is applied to die recess 26 and punch receiving space 38 of die 18 through bore 118 in die holder 14 and bore 120 in die 18, preferably at the end of each cycle, to remove any debris that may have accumulated in either of them during a punching and forming operation.

Compressed air can be used to exert a downward pressure on pressure pad 72 in conjunction with spring 76 or as an alternative. Compressed air, if used, would be applied through bore 122 in punch holder 52 and bore 124 through wall 62 of punch 56.

In the preferred embodiment the cutting edges of the punch and die and the forming edges of the punch and forming block are squares. It is believed to be obvious that they can be made in other desired shapes such as rectangular, circular, or eliptical for example.

From the foregoing, it is believed obvious that this invention solves the problem of cutting and forming very thin ductile leads of an integrated circuit chip in a single operation of a set of blanking and forming dies.

It should be evident that various modifications can be made to the described embodiment without departing from the scope of the present invention.

What is claimed is:

1. In combination: die wall means, said die wall means having a planar upper surface and contiguous inner surfaces substantialy perpendicular to the upper surface, the inner surfaces of the die wall means forming a die recess, the intersections of the upper surface and the inner surfaces defining continuous die cutting edges lying in a die cutting plane, said die wall means adapted to be mounted on the base plate of a punch press;

a forming block removably mounted in the die recess; said forming block having an upper surface and contiguous outer surfaces, continuous forming edges positioned substantially at the intersections of said outer surfaces and the upper surface, the outer surfaces of the forming block being spaced a predetermind distance from the inner surfaces of the die to define a punch receiving space, the upper surface of the forming block substantially lying in the die cutting plane, and a recess formed in the upper surface of the forming block adapted to receive a work piece;

punch wall means, said punch wall means having a planar bottom surface, contiguous outer surfaces and contiguous inner surfaces, the inner and outer surfaces being substantially perpendicular to the bottom surface, the inner surfaces forming a punch recess, the intersections of the bottom surface and the outer surfaces of the punch wall means forming continuous punch cutting edges, and continuous punch forming edges positioned substantially at the intersections of the bottom surface and the inner surfaces; said punch cutting edges lying in a punch cutting plane, a portion of the punch wall means adapted to fit within the punch receiving space of the die, said punch wall means adapted to be mounted on the top plate of a punch press;

a pressure pad reciprocally mounted in the punch recess for reciprocal movement therein; and means for exerting pressure on the pressure pad to force the pad toward the forming block, said pressure pad normally projecting below the punch cutting plane.

2. The combination of claim 1 in which the cross-sectional areas within the die cutting edges, the forming edges of the forming block, the punch cutting edges, and the punch forming edges are rectangular.

3. The combination of claim 1 in which the cross-sectional areas defined by the die cutting edges, the forming edges of the forming block, the punch cutting edges, and the punch forming edges are squares.

4. Apparatus for cutting and forming thin strips of a ductile metal comprising:
 a punch press, said press having a base plate, a top plate, and means for reciprocally moving substantially vertically the top plate toward the base plate;
 a die holder removably secured to the base plate;
 a hollow die mounted in said die holder, said die having continuous die cutting edges lying in a die cutting plane;
 a forming block removably mounted in the die, said forming block having a top surface and side walls, the top surface of the forming block being substantially coplanar with the die cutting plane; the side walls of the forming block being spaced from the die to form a punch receiving space, and continuous forming edges located substantially at the intersections of the top surface and the side walls of the forming block, the side walls of the forming block tapering inwardly from the forming edges;
 a punch holder removably secured to the top plate of the punch press for reciprocal movement with the top plate;
 a punch mounted in said punch holder, said punch having wall means, said wall means having contiguous inner surfaces, a bottom surface lying in a punch cutting plane, and contiguous outer surfaces, the inner surfaces of the wall means forming a punch space, the intersections of the bottom surface of the punch and the outer surfaces of the punch forming continuous punch cutting edges in the punch cutting plane, and continuous punch forming edges located substantially at the intersections of the inner surfaces of the punch and the bottom surface; said punch being mounted on the punch holder so that the punch cutting plane is substantially parallel to the die cutting plane, the punch being positioned relative to the die so that the punch cutting edges are in cutting relationship with the die cutting edges, and the forming edges of the punch are in forming relationship with the forming edges of the forming block as the bottom surface of the punch moves into the punch receiving space in the die;
 a pressure pad mounted for reciprocal motion in the punch space; said pressure pad extending below the lower surface of the wall means of the punch; and
 means for biasing the pressure pad toward the forming block to exert pressure on the top surface of the forming block before the punch cutting plane is substantially coplanar with the die cutting plane.

5. The apparatus as defined in claim 4 in which the die cutting edges, the punch cutting edges, the punch forming edges, and the forming edges of the forming block define rectangles.

6. The apparatus as defined in claim 4 in which the die cutting edges, the punch cutting edges, the punch forming edges, and the fomring edges of the forming block define squares.

7. Apparatus for cutting and forming the flexible beam leads of an integrated circuit chip comprising:
 a punch press, said press having a base plate and a top plate, means for reciprocally moving substantially vertically the top plate relative to the base between a first position in which the base plate and top plate are separated a maximum distance and a second position in which they are separated by a minimum distance;
 a die holder removably secured to the base plate;
 a hollow die mounted in said die holder, said die having continuous die cutting edges lying in a die cutting plane;
 a forming block mounted in the die; said forming block having a top surface and contiguous side walls; the top surface being substantially coplanar with the die cutting plane; continuous forming edges on the forming block positioned substantially at the intersections of the top surface and the side walls of the forming block; the side walls of the forming block being spaced from the die to form a punch receiving space; the side walls of the forming block tapering inwardly from the forming edge; and a chip receiving recess formed in the top surface of the forming block adapted to receive an integrated circuit chip;
 a punch holder removably secured to the top plate of the punch;
 a punch mounted in said punch holder; said punch having punch wall means; said punch wall means having contiguous inner surfaces, outer surfaces, and a bottom surface; the inner surfaces of the punch wall means forming a punch space; the intersections of the bottom surface of the punch and the outer surfaces of the punch forming continuous punch cutting edges lying in a punch cutting plane; and continuous punch forming edges located substantially at the intersections of the inner surfaces of the punch and the bottom surface; said punch being mounted on the punch holder so that the punch cutting plane is substantially parallel to the die cutting plane; the punch being positioned relative to the die so that the punch cutting edges are in cutting relationship with the cutting edges of the die, and the punch forming edges are in forming relationship with the forming edges of the forming block during the period in which the top plate of the punch moves from its first position to its second;

a pressure pad mounted for reciprocal motion in the punch space; said pressure pad extending below the punch plane of the punch; and means for biasing the pressure pad downwardly to exert a predetermined pressure on the leads of a chip positioned in the chip receiving recess of the forming block before the punch cutting plane is substantially coplanar with the die cutting plane during the period in which the top plate moves from its first position to its second.

8. Apparatus as defined in claim 7 in which the cross-sectional areas within the die cutting edges, the forming edges of the forming block, the punch cutting edges, and the punch forming edges are rectangular.

9. Apparatus as defined in claim 7 in which the cross-sectional areas defined by the die cutting edges, the forming edges of the forming block, the punch cutting edges, and the punch forming edges are squares.

10. Apparatus as defined in claim 7 in which the pressure pad is provided with means for removably holding a chip and its formed leads against the pressure pad as the top plate moves from its second position to its first.

11. Apparatus as defined in claim 7 in which the die is provided with compressed air means for clearing the punch receiving space.

12. Apparatus for cutting and forming the flexible beam leads made of a ductile metal of an integrated circuit chip having four sides, four groups of leads with each group of leads projecting normally from a different side of a chip, the chip being attached by its leads to a segment of a strip of film, the segment having a pair of reference sprocket holes and a window, with the inner portion of the leads bonded to the chip extending over the window and with the chip positioned in the window; comprising:

a punch press, said press having a base plate and a top plate, means for mounting the top plate for substantially vertical reciprocal linear motion with respect to the base plate between a first position in which the top plate is spaced at a maximum distance from the base plate and a second position in which the top plate is placed at a minimum distance from the base plate;

means for causing the top plate to move from its first position to its second position and then to return to its first position;

die wall means, said die wall means having an upper planar surface and inner surfaces substantially perpendicular to the upper planar surface, the inner surfaces of the die wall means forming a die recess, the intersections of the upper surface and the inner surfaces of the die wall means defining continuous die cutting edges, said die cutting edges lying in a die cutting plane, means for removably mounting the die wall means on the base plate;

a forming block removably mounted in the die recess, said forming block having an upper surface and outer surfaces, continuous forming edges positioned substantially at the intersections of the outer surfaces and the upper surface of the forming block, the outer surfaces of the forming block being spaced a predetermined distance from the inner surfaces of the die wall means to form a punch receiving space, the upper surface of the forming block substantially lying in the die cutting plane, a recess formed in the upper surface of the forming die adapted to receive an integrated circuit chip whose leads are to be cut and formed;

a punch holder removably secured to the top plate of the punch press;

punch wall means, said punch wall means having a bottom planar surface, inner surfaces, and outer surfaces, the inner and outer surfaces being normal to the bottom surface, the inner surface of the wall means forming a punch space, the intersections of the bottom surface of the punch wall means and the outer surfaces of the punch wall means forming continuous punch cutting edges, said punch cutting edges substantially lying in a punch cutting plane, and continuous punch forming edges positioned substantially at the intersections of the inner surfaces of the punch wall means and the bottom surface;

means for removably mounting said punch wall means on the punch holder so that the punch cutting plane is substantially parallel to the die cutting plane; so that the punch cutting edges are in shearing relationship with the die cutting edges, and so that the punch forming edges are in forming relationship with the forming edges of the forming block as the top plate of the punch press moves from its first position to its second position;

a pressure pad made of a resilient material mounted for reciprocal motion in the punch space;

means for resiliently biasing the pressure pad toward the die wall means;

die alignment bores formed in the die holder;

punch alignment bores formed in the punch holder;

a film alignment pin mounted in each punch alignment bore for reciprocal motion therein;

a pin lifter;

means mounted on the top plate having a rod connected to the pin lifter for moving the alignment pins from a position in which they project below the punch cutting plane sufficiently to enter into the die alignment bores of the die holder and to withdraw the film alignment pins so that they are above the punch cutting plane of the punch, said alignment pins adapted to enter the reference sprocket holes of a film segment placed between the punch wall means and the die wall means with the integrated circuit chip positioned in the recess in the forming block to accurately position the chip and its leads with respect to the die cutting edges with the flexible leads of the four groups of leads attached to the chip in contact with the upper surface of the forming block and the upper surface of the die wall means, said pressure pad engaging and clamping the flexible leads to the upper surface of the forming block prior to the punch and die cutting edges severing all of the leads and the forming edges of the punch wall means and forming block bending all of them.

13. The apparatus of claim 12 in which the cross-sectional areas within the die cutting edges, the forming edges of the forming block, the punch cutting edges and punch forming edges are rectangular.

14. The apparatus of claim 12 in which the cross-sectional areas defined by the die cutting edges, the forming edges of the forming block, the punch cutting edges, and the punch forming edges are squares.

15. Apparatus as defined in claim 12 in which the pressure pad is provided with means for removably holding a chip and its formed leads against the pressure pad as the top plate moves from its second position to its first.

16. Apparatus as defined in claim 12 in which the die is provided with compressed air for blowing debris from the punch receiving space.

17. Apparatus as defined in claim 12 in which the means mounted on the top plate for moving the alignment pins is an air cylinder.

* * * * *